United States Patent
Kim et al.

(10) Patent No.: US 6,242,275 B1
(45) Date of Patent: Jun. 5, 2001

(54) METHOD FOR MANUFACTURING QUANTUM WIRES

(75) Inventors: Sung Bock Kim; Jeong Rae Ro; El Hang Lee, all of Daejon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 09/137,617

(22) Filed: Aug. 21, 1998

(30) Foreign Application Priority Data

Sep. 8, 1997 (KR) .................................................. 97-46100

(51) Int. Cl.$^7$ ................................................. H01L 21/20
(52) U.S. Cl. .............................. 438/47; 438/94; 438/701; 438/962
(58) Field of Search ................................. 438/40, 46, 47, 438/94, 962, 701, 759, 763

(56) References Cited

U.S. PATENT DOCUMENTS

| | | | |
|---|---|---|---|
| 5,138,625 | 8/1992 | Paoli et al. | 372/46 |
| 5,372,675 | * 12/1994 | Wakabayahi | 156/649 |
| 5,577,062 | 11/1996 | Takahashi | 372/46 |
| 5,663,592 | * 9/1997 | Miyazawa | 257/627 |
| 6,011,271 | * 1/2000 | Sakuma | 257/14 |

* cited by examiner

Primary Examiner—Mary Wilczewski
Assistant Examiner—David Goodwin
(74) Attorney, Agent, or Firm—Cohen, Pontani, Lieberman, Pavane

(57) ABSTRACT

A method for manufacturing quantum wires is provided in which a stacked structure having AlAs layers and GaAs layers alternatively is formed, V-grooves are formed beside the GaAs layers and the quantum wires are formed using the V-grooves. The method for manufacturing quantum wires, which method includes the following steps: growing a GaAs buffer layer on the facet (011) of a GaAs single crystal substrate; growing an AlAs layer for using as oxide mask and a GaAs layer for a V-groove alternatively on the GaAs buffer layer so that each GaAs layer is stacked between an AlAs layer and an adjacent AlAs layer; growing the cover layer of GaAs on the AlAs layer which is grown as the top layer of the structure; cutting the entire structure including the GaAs cover layer to the perpendicular direction of (011), whose structure is grown in the orientation of (011) entirely, so as to expose the facet (100); performing a heat treatment for the entire structure cut to expose the facet (100) and forming oxide film on the exposed portion of each AlAs layer; etching each exposed GaAs layer chemically using the oxide as mask and forming V-groove so that the facet (111) of GaAs layer is exposed; and growing the quantum wire in the V-groove.

7 Claims, 1 Drawing Sheet

METHOD FOR MANUFACTURING QUANTUM WIRES

BACKGROUND OF THE INVENTION

1. Field of the Invention

This invention relates to a method for manufacturing quantum wires. More particularly, this invention relates to the method for manufacturing quantum wires in which when a stacked structure having alternative layers of AlAs and GaAs is formed, the V-grooves are formed beside the GaAs layers and the quantum wires are formed using the V-grooves.

2. Description of the Related Art

The technology of the thin film growing and the microscopic device manufacturing is going into the quantum concept beyond the classical analysis realm. One of such devices is a semiconductor laser diode which uses the quantum well effect and it is used as a powerful laser device in its efficiency and output. As expected and embodied in the theoretical calculation and research step of the laboratory level, the embodiment of the device using quantum wires and quantum dots shows the characteristic of the device having a higher efficiency in comparison with the quantum well device. However, the manufacturing technology of quantum wires and quantum dots has been in the low level until now.

The quantum wires are manufactured using the patterns under the sub micrometer, which are formed by the ion beam or the electron beam lithography method. Thus, the quantum wires are manufactured by forming the quantum well and then producing the pattern through the electron beam lithography method and using the re-growth method, or by forming the insulator mask through the electron beam lithography method and then using the selective growth method. Also, the quantum wires are manufactured in the V-groove formed by producing the pattern through electron beam and photo lithography and by using the chemical etch.

However, in the methods described above, the efficiency of quantum is reduced due to the limitation of electron beam size and the defects occurring in the lithography process.

SUMMARY OF THE INVENTION

The object of the present invention is to manufacture fine quantum wires of several nm using the natural properties of matter to acquire the cheap price and little defect.

The method for manufacturing quantum wires according to the invention includes the steps of growing a GaAs buffer layer on the (011) plane of a GaAs single crystal substrate; growing an AlAs layer to use as a mask, and growing a GaAs layer for a V-grooves alternatively on the GaAs buffer layer so that each GaAs layer is stacked between one AlAs layer and an adjacent AlAs layer; growing the cover layer of GaAs on the AlAs layer which is the top layer of the structure; cutting the entire structure including the GaAs cover layer to the perpendicular orientation of (011), whose structure is in the orientation of (011) entirely, so as to expose the facet (100); performing a heat treatment the entire structure cut to expose the facet (100) and forming oxide film on the exposed portion of each AlAs layer; etching each exposed GaAs layer chemically using the oxide film on AlAs layers as a mask and forming V-groove so that the facet (111) of GaAs layer is exposed; and growing the quantum wire in the V-groove.

The above and further objects, aspects and novel features of the invention will become more apparent from the following detailed description when read in connection with the accompanying drawings.

BRIEF DESCRIPTION OF THE DRAWINGS

For fuller understanding of the nature and object of the invention, reference should be had to the following detailed description taken in conjunction with the accompanying drawings in which.

Similar reference chracters refer to similar parts ins the several views of the drawings.

DESCRIPTION OF THE PREFERRED EMBODIMENT

Figure 1A:
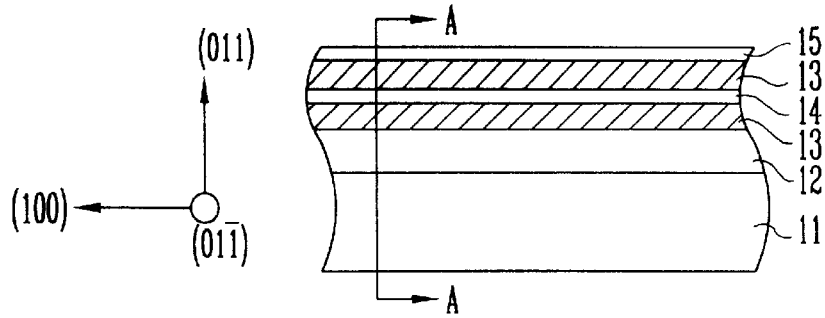
FIGS. 1a to 1d show the cross-sectional views which explain the method for manufacturing quantum wires according to the present invention.

As shown in FIG. 1a, a GaAs single crystal substrate 11 is arranged in a way that the (011) plane of it looks upward, and a buffer layer 12 is grown on the facet in an order, so that the quality of the thin film can be excellent. The buffer layer 12 is grown under several hundreds nm in its thickness using the same material as the substrate, and its desired thickness is less than 500 nm. An AlAs layer 13 is grown on the buffer layer 12 in several nm to several $\mu$m thickness, and a GaAs layer 14 is grown on the AlAs layer 13 in several nm. The GaAs layer 14 acts as a substrate which forms the V-groove through chemical etch in the following process, and the AlAs layer 13 is an aluminium compound which forms an oxide film used as a mask pattern when the GaAs layer 14 is etched. Therefore, in the process of forming the V-groove to make the quantum wire to be in the GaAs layer 14, the size of V-groove depends on the thickness of the GaAs layer 14 and the distance between one V-groove and the next V-groove depends on the thickness of the AlAs layer 13, thus letting the thicknesses of the AlAs layer 13 and the GaAs layer 14 to control to make desired V-groove shape. Also, the AlAs layer 13 and the GaAs layer 14 are grown alternatively and repeatedly as many times as the expected number of quantum wires. Since the last stacked AlAs layer 13 in the stack layers oxidizes easily, the cover layer 15 of GaAs in the thickness of several nm is grown and protects the last stacked AlAs layer 13.

Each layer in the stack structure is grown in the same orientation of facet (011) due to the orientation of crystal of GaAs used as the substrate 11, and therefore, facet (100) of each layer is exposed if the stacked layers are cut along the line A—A.

Figure 1B:
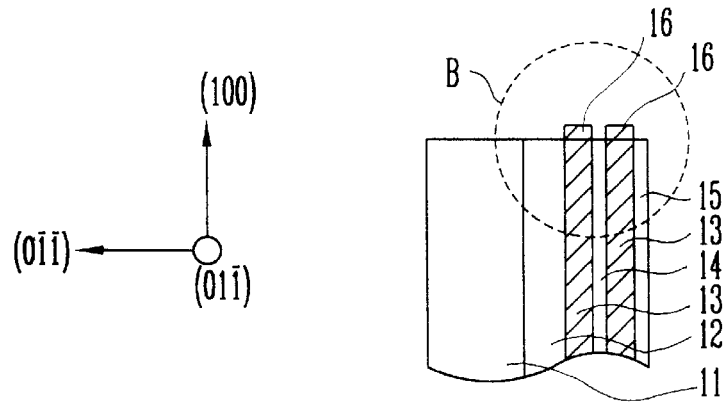

FIG. 1b shows the sectional view of the stacked structure cut along the line A—A of FIG. 1a. As it can be seen in FIG. 1b, the section is shifted so that the facet (100) looks upward and it is treated with thermal oxidation process. The exposed portion of each AlAs layer 13 in the stacked structure is oxidized due to the heat treatment and the oxide films 16 are formed. The oxide film 16 pattern can be formed on the top of AlAs layer 13 selectively as shown in the Figure since the aluminum (Al) atoms oxidize stably when they are combined with oxygen. Since the oxide film 16 patterns have the same widths, that is several nm, as that of AlAs layer 13, much finer patterns can be formed compared to the electron beam, and the stability and reproducibility of process is excellent using the properties of the matter of the aluminum atom is a natural phenomenon.

Figure 1C:
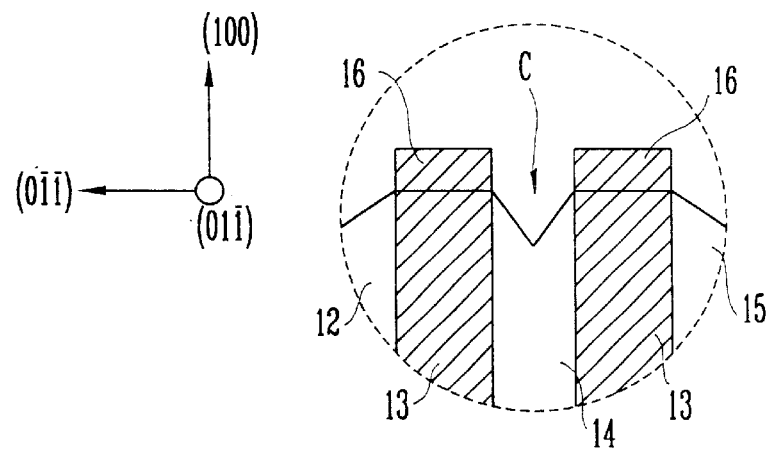

FIG. 1c shows the sectional view in which a V-groove is formed in the GaAs layer 14 through the chemical wet etch using the oxide film 16 pattern as a mask. FIG. 1c is a magnified view of B in FIG. 1b, which shows the V-groove in detail, formed on the GaAs layer 14. The solution used for the chemical etching process may be the solution which has $H_2SO_4$, $H_2O_2$ and $H_2O$ mixed in the ratio of 1:8:40 or 2:1:1. The GaAs layer 14 can be etched in the shape of V as indicated in C after performing the chemical etching using the solution. Since the exposed facet of the GaAs layer 14 before etching is directed to orientation (100), the exposed facet of V-groove is etched in the orientation (111).

Figure 1D:
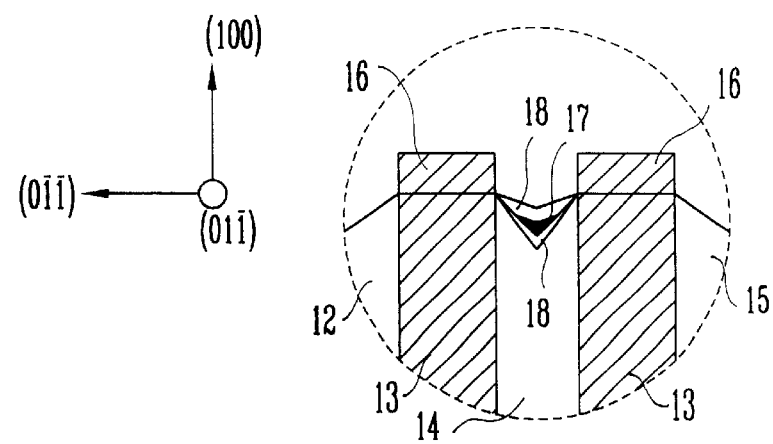

The quantum wire is grown in the V-groove, as shown in FIG. 1d. The method of growing the quantum wire is as follows. At first, a barrier layer 18 is grown in the V-groove, a well layer 17 is formed using the GaAs or InGaAs and another barrier layer 18 is grown to bury the well layer 17 in two dimension. The barrier layer 18 may be AlGaAs when using the GaAs as the well layer 17 since the former material has higher band gap energy than the latter one. The barrier layer 18 may be GaAs when using the InGaAs as the well layer 17 since the former material has higher band gap energy than the later one.

In accordance with the invention, since fine mask can be produced through the oxide pattern having several nm and less using natural properties of aluminum (Al) instead of using the electron beam lithography process, costs can be reduced and excellent stability and reproducibility can be obtained. In addition, since the size and width of V-groove can be controlled by varying the thicknesses of the GaAs layer and the AlAs layer, the manufacturing of quantum wires having high efficiency and no defects can be obtained.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expendient variations that may be made within the scope and the spirit of the present invention are to be encompassed as further embodiments of the present invention.

What is claimed is:

1. A method of making quantum wires, on a structure grown in an orientation of (011) including a GaAs single crystal substrate having a facet, a GaAs buffer layer and at least one layer of GaAs and AlAs, said method comprising the steps of:
   (1) growing a GaAs buffer layer on the facet of the GaAs single crystal substrate;
   (2) growing an AlAs layer for forming a mask;
   (3) growing a GaAs layer for forming a V-groove;
   (4) sequentially repeating steps (2) and (3) for forming a plurality of quantum wires in each respective GaAs layer grown at step (3);
   (5) depositing a protective cover layer of GaAs on the uppermost AlAs layer grown on the structure;
   (6) cutting the entire structure including the GaAs protecting cover layer in a perpendicular direction of (011), so as to expose the facet in an orientation of (100);
   (7) heating the entire structure to expose the facet for forming an oxide film pattern on the exposed portion of each AlAs layer;
   (8) etching each exposed GaAs layer chemically using the oxide as mask an forming V-groove so that the facet (111) of GaAs layer is exposed; and
   (9) growing the quantum wire in the V-groove
      (a) growing a first barrier layer in the V-groove;
      (b) forming a well layer using one of GaAs and InGaAs; and
      (c) growing a second barrier layer for burying the well layer in two dimensions.

2. The method of making quantum wires as claimed in claim 1, wherein the thickness of GaAs buffer layer is no greater than 500 nm, the thickness of AlAs layer grown at step (2) is several nm to several $\mu$m and the thickness of GaAs layer grown at step 3 is several $\mu$m.

3. The method of making quantum wires as claimed in claim 1, in which the number of GaAs layers stacked equals the desired number of quantum wires.

4. The method of making quantum wires as claimed in claim 1, in which the solution used for the chemical etching process of step (8) has $H_2SO_4$, $H_2O_2$ and $H_2O$ mixed in the ratio of one of 1:8:40 and 2:1:1.

5. The method of making quantum wires as claimed in claim 1, in which the well layer of quantum wires is one of GaAs and InGaAs, and the barrier layer of quantum wires is one of AlGaAs and InGaAs.

6. The method of making quantum wires as claimed in claim 1, wherein the AlAs layer is an aluminum compound which forms an oxide film used as a mask pattern when the GaAs layer is etched.

7. The method of making quantum wires as claimed in claim 1, wherein step (a) is performed by:
   (a) growing a first barrier layer in the V-groove;
   (b) forming a well layer using one of GaAs and InGaAs; and
   (c) growing a second barrier layer for burying the well layer in two dimensions.

* * * * *